United States Patent
Simoes et al.

(10) Patent No.: US 6,483,033 B1
(45) Date of Patent: Nov. 19, 2002

(54) CABLE MANAGEMENT APPARATUS AND METHOD

(75) Inventors: Michael Simoes, Fall River, MA (US); John L. Moran, III, Millville, MA (US); Stanley Ivas, Mansfield, MA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/686,238

(22) Filed: Oct. 11, 2000

(51) Int. Cl.[7] .................................................. H02G 3/00
(52) U.S. Cl. ..................... 174/72 A; 174/69; 174/99 E; 174/135; 242/360; 242/364
(58) Field of Search ................................ 174/72 A, 69, 174/99 E, 135; 242/165, 360, 364, 388; 439/578, 761, 803

(56) References Cited

U.S. PATENT DOCUMENTS

| | | | |
|---|---|---|---|
| 4,901,938 A | * | 2/1990 | Cantley et al. .......... 242/378.1 |
| 5,723,815 A | * | 3/1998 | Pena ............................ 174/53 |
| 5,768,084 A | * | 6/1998 | Chaudhry et al. .......... 361/120 |
| 6,019,304 A | * | 2/2000 | Skowronski et al. ....... 242/373 |
| 6,181,562 B1 | * | 1/2001 | Berg et al. .................. 361/719 |
| 6,196,488 B1 | * | 3/2001 | Sakata et al. ............... 242/388 |
| 6,276,502 B1 | * | 8/2001 | Leyba et al. ........... 191/12.2 R |

\* cited by examiner

Primary Examiner—Dean A. Reichard
Assistant Examiner—W. David Walkenhorst
(74) Attorney, Agent, or Firm—Paul F. Bawel

(57) ABSTRACT

A cable management system for electronic patchboard and routing systems. Cables are fabricated in a uniform length with appropriate termination Functional sets of cables are bundled and enclosed in a distinctly identifiable bundling material. Bundles are wrapped around a reel which has features for removable attachment to a cabinet. Reels are removably mounted to the cabinet at locations chosen to facilitate neat cable dressing. Appropriate lengths of cable are unwound from the reel. Cables are connected to associated connection points while leaving excess cable lengths wrapped around the reel.

8 Claims, 3 Drawing Sheets

CABLE MANAGEMENT APPARATUS AND METHOD

FIELD OF THE INVENTION

The present invention relates to a method and apparatus for managing multiple signal transmission cables and more particularly to managing and routing multiple cable interconnections within an enclosure.

BACKGROUND OF THE INVENTION

Modern head-end, termination systems, matrix switches and routing circuits provide extremely dense components and plug panels. When interconnecting point-to-point pathways in such systems, cables are used. An example is a cable of a certain length to connect a particular CMTS (cable modem termination station) and a matrix switch. Cable lengths are determined to provide the point to point connection without having excess cable which can kink, undergo bending stress or which must be contained within an enclosed area where space it tight. With the great number of cables requires in such dense systems, proper identification and routing is problematic. Technicians have great difficulty visually identify the routing of a particular cable inside an enclosure stuffed with a great number of similar cables. Removing and adding cables without disturbing the position of existing cables is also difficult.

In many such patch cables, the length of the cable can greatly affect the cables electrical characteristics. A method of cable management that uses a variety of cable lengths introduces undesirable system complexity because electrical characteristics of cable (both coaxial cable and any other type of cable) varies as a function of cable length. For example, in the range of 5 to 900 MHz, signal amplitude in a one foot forward path cable connecting an RF Matrix Switch to a nearby CMTS may differ by greater than 1 dB from signal amplitude in a six foot forward path cable connecting an RF matrix switch to a more distant CMTS. CMTS transmit level settings must therefore be adjusted to accommodate each particular cable length. Industry specifications, for example the Data-Over-Cable Service Interface Specifications Radio Frequency Interface Specification SP-RFI-I02-971008 (DOCSIS 1.0), and Data-Over-Cable Service Interface Specifications Radio Frequency Interface Specification SP-FRIv1.1-I03-991105RF Specifications (DOCSIS 1.1), demand tight transmit level tolerances. Therefore, management of a typical system having six CMTS units would require reference to six calibration tables and additionally would require maintaining a list that correlates each CMTS to a corresponding connected RF Matrix Switch port. Each calibration table specifies particular adjustments to the CMTS transmit level depending on frequency of the modulated carrier. Multiple cable lengths cause extra complexity such as referencing multiple calibration tables and tracking which cable length and calibration table corresponds to which CMTS etc., which renders such systems inefficient, impractical and error prone.

Interconnection systems having a single standard cable length typically present disadvantageous opportunities for incorrect cable connections. For example, a large bundle of cables that is not neatly routed may obscure a technician's visual access to connection points thereby presenting opportunities for improper connections. Such cable bundles also often restrict manual access or tool access to connection points thereby making physical connections difficult and increasing the time required to install and replace cables. Extra lengths of cable near connection points frequently become tangled and provide additional opportunity for improper connections because technicians may not be able to visually identify a cable by following it through a tangled mass. Such tangled masses of electrical cables may also disadvantageously reduce heat dissipation in the area of the cables.

Optical patch cords used in fiber optic networks also suffer from these problems.

Although optical patch cord characteristics are less affected by length (at least in regards to short lengths of several meters or less), they are very susceptible to bends and kinks, which will attenuate the ability of the optical patch cord to carry signals.

One well known method of neat cable routing requires individual installation and dressing of cables in an equipment cabinet. Cables are cut to custom lengths in the field and connectors are crimped onto each end using special hand tools. Such individual cable preparation is labor intensive and cost prohibitive. Furthermore, hand crimping of connectors in the field often provides connections having poor quality control compared to connections that are made and tested in a factory. The resulting variety of cable lengths having various electrical properties presents calibration problems as previously discussed.

Another method to facilitate neat cable routing is to provide an inventory of factory made cables of various lengths. However, maintaining such an inventory significantly increases costs of cable inventory management. This method also provides significant opportunity for errors, for example, whereby improper cables may be selected which do not match the calibration levels of a particular system.

SUMMARY OF THE INVENTION

The present invention is directed towards a bundle having at least two equal length cables having terminating hardware connected to each end of the cables, an identifiable grouping structure at least partially enclosing the bundle, and a reel positioned to allow the bundle to be at least partially wrapped around the reel. An example of an identifiable grouping structure includes a flexible mesh sleeve. The flexible mesh sleeve can be a different color from a second flexible mesh sleeve at least partially enclosing a second cable apparatus. The reel is removably mountable to a mounting structure.

An illustrative embodiment of the present invention relates to a cable management system in high availability HFC network system. An RF matrix switch is typically mounted in a rack or cabinet with multiple CMTS units stacked below the RF matrix switch in the same rack or cabinet. Cable bundles are provided having a constant length that is sufficient to connect a RF matrix switch to a most distant CMTS unit. Each cable bundle is wrapped around a reel to take up slack resulting from any excess cable length. Each reel is detachably mounted in the cabinet or rack proximal to a corresponding CMTS to which the particular bundle on the reel is connected. Cable bundles may be encased in a flexible wrapping material which may be provided in various colors for differentiation to identify a particular set of interconnections. Each cable is terminated appropriately to provide a robust and ergonomic connection point between the cable and the RF matrix switch on one end and between the cable and the CMTS on the other end.

Features of the present invention include a method and apparatus for providing neat cable routing in an HFC network between RF matrix switches and CMTSs having uniform electrical properties. The present invention thereby facilitates simplified calibration of HFC network components. Neat cable routing according to the present invention provides the additional features of increased visual and physical access to connection points. Such increased visual and physical access to connection points reduces probability of improper connections. Neat cable routing also increases spacing between cables thereby improving system heat dissipation around the cables. Further, properly routed cables are advantageously less susceptible to vibrations which degrade connections and shorten the useful life the cables.

Additional features of the present invention include a cable handling method and apparatus that is easily installable and removable. The invention also includes identification features associated with each cable bundle and thereby facilitates efficient connections to the proper connection points. Such "quick-swappable" character and identification features of the present invention reduces system component replacement time and thereby increases system availability.

Further features of the invention include a compact and efficient cable packaging method and apparatus that is easily stored in inventory, shipped and handled. A single component part number is used for variety of connections thereby minimizing inventory and handling costs. Use of a single component type for a variety of connections also eliminates any possibility of selecting the incorrect connector type.

Another feature of the present invention is to provide an interconnection system that is fabricated in a factory environment under factory quality control conditions. No field dressing or field termination of cables is necessary, therefore connection quality is maximized.

BRIEF DESCRIPTION OF THE DRAWINGS

These and other features and advantages of the present invention will become more apparent in light of the following detailed description of an illustrative embodiment thereof, as illustrated in the accompanying drawings of which.

DETAILED DESCRIPTION OF THE INVENTION

The method and apparatus according to the present invention provides a cable management system to ensure proper cable dressing using cables having consistent electrical properties. Manageable bundles of cables having a consistent length are constructed with robust termination matching respective connection points.

Components of a high availability HFC (Hybrid Fiber Coax) network system include multiple Cable Management Termination Systems (CMTS) and radio frequency matrix switches (RF matrix switch). Each CMTS is typically connected by a bundle of cables to a corresponding RF matrix switch. The interconnecting cables are typically coaxial cables fabricated to a specific length depending upon the spacing between a particular CMTS and the corresponding RF matrix switch. Cable lengths are determined to provide precise point to point connections having proper cable dressing without kinks, bending stresses or excess cable lengths. Proper cable dressing allows technicians to visually identify the routing of a particular cable with relative ease. Expedient and accurate cable identification is necessary to facilitate replacement of failed cables or circuits.

Figure 1:
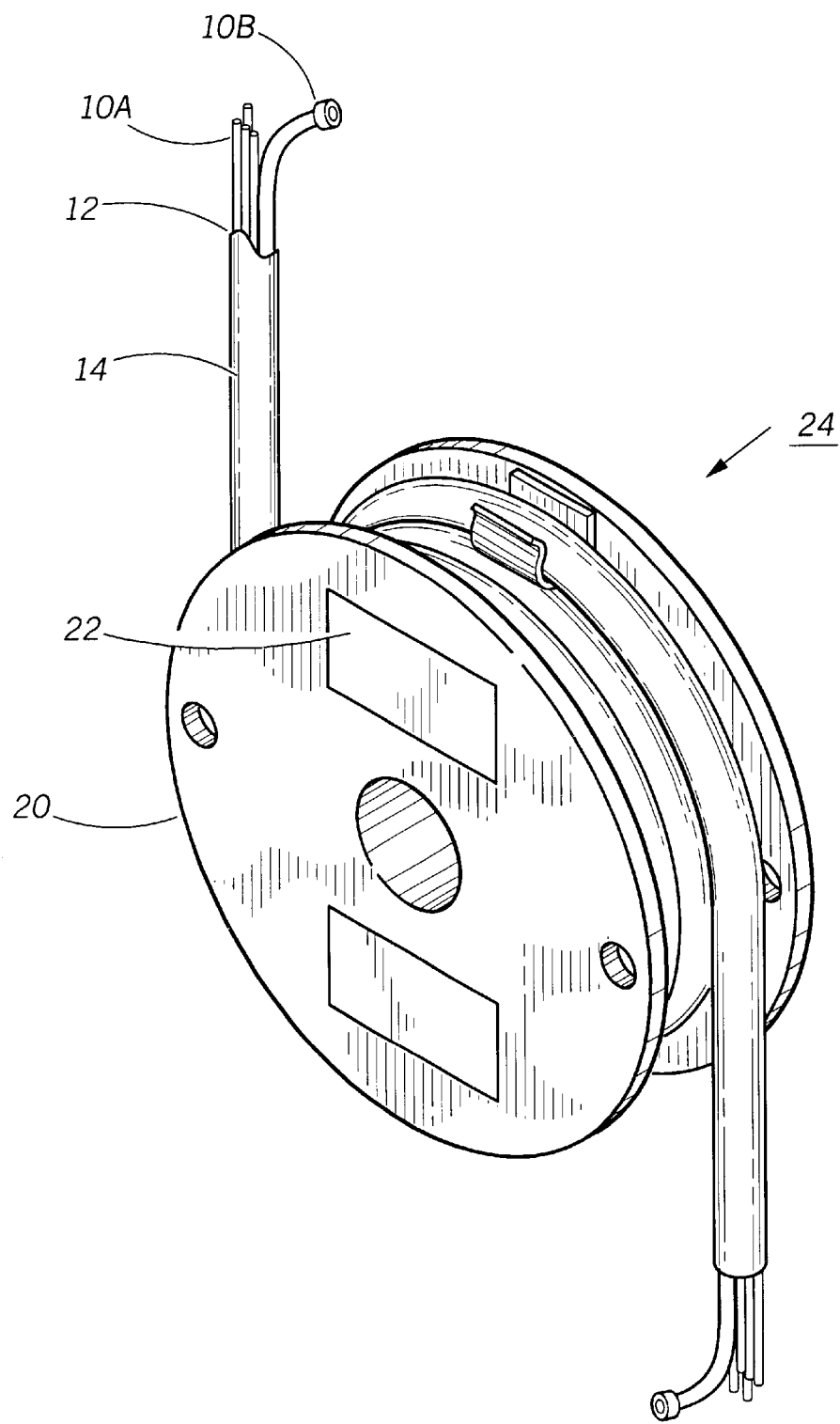
FIG. 1 is a pictorial view of a reeled cable assembly according to at least one embodiment of the present invention.
Figure 2:
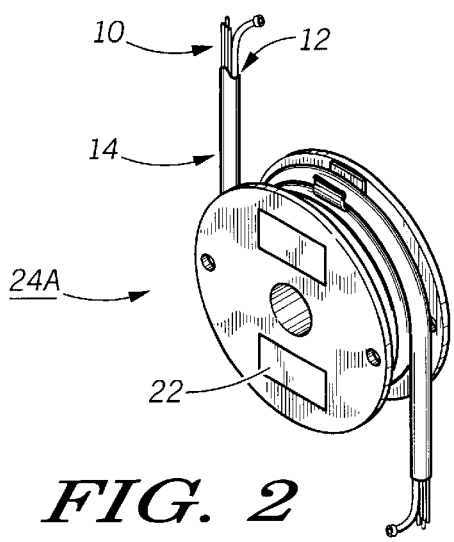
FIGS. 2–7 are pictorial views of a set of reeled cable assemblies according to at least one embodiment of the present invention.
Figure 5:
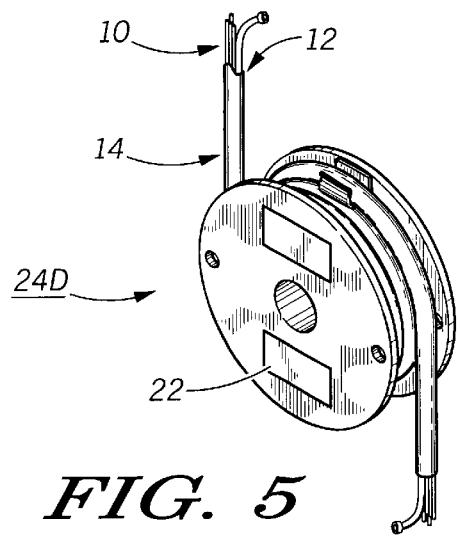
Figure 3:
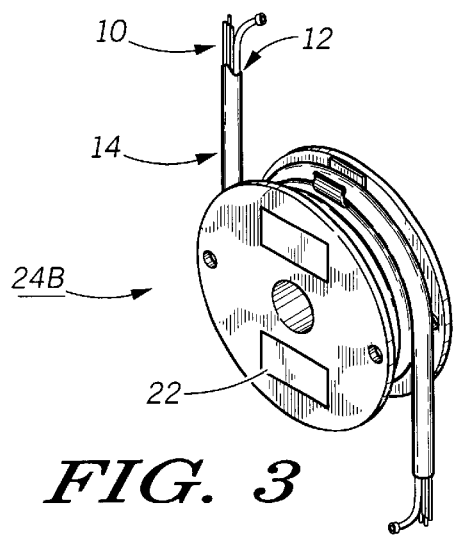
Figure 6:
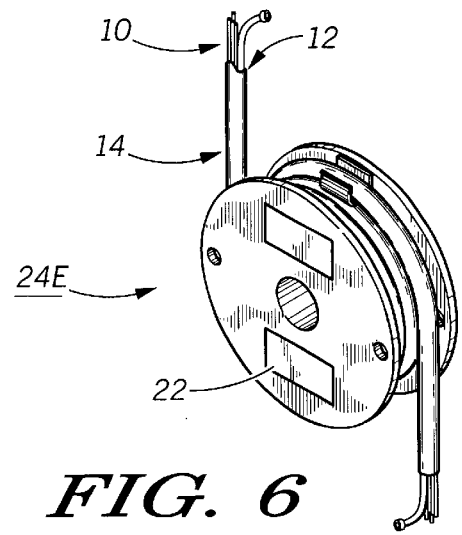
Figure 4:
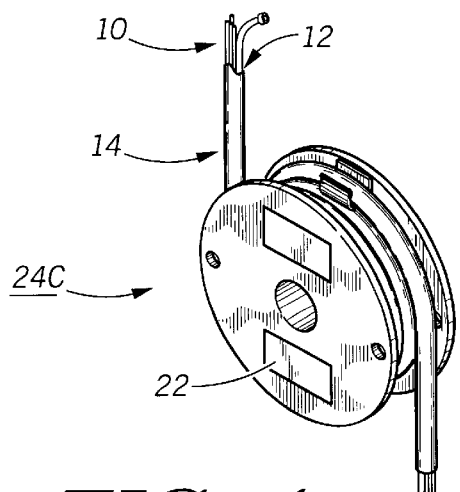
Figure 7:
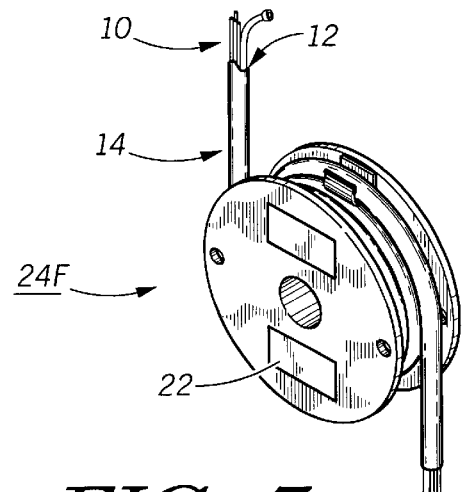

FIG. 1 illustrates an exemplary embodiment of a reeled cable assembly according to the present invention. A bundle 14 of equal length cables 10 including one forward path cable and eight return path cables are encased in a flexible mesh sleeve 12. The bundle 14 of cables 10 together with the flexible mesh sleeve 12 is wrapped around a reel 20. A mounting system 22 such as VELCRO® fastener is attached to an outside surface of the reel for removably mounting the reel to a cabinet.

Referring now to FIGS. 2–8 a set of six reeled cable assemblies 24a–24f, respectively, according to an embodiment of the present invention are shown. Each of the six reeled cable assemblies 24a–24f is substantially identical except for the color of the flexible mesh sleeve 12 which is used to distinguish and identify a particular bundle 14 of cables 10 for connection to proper circuits. Alternatively, the flexible sleeves 12 can include other distinguishing features, such as texture, numbering or color banding. The length of all cables 10 are substantially identical.

Figure 8:
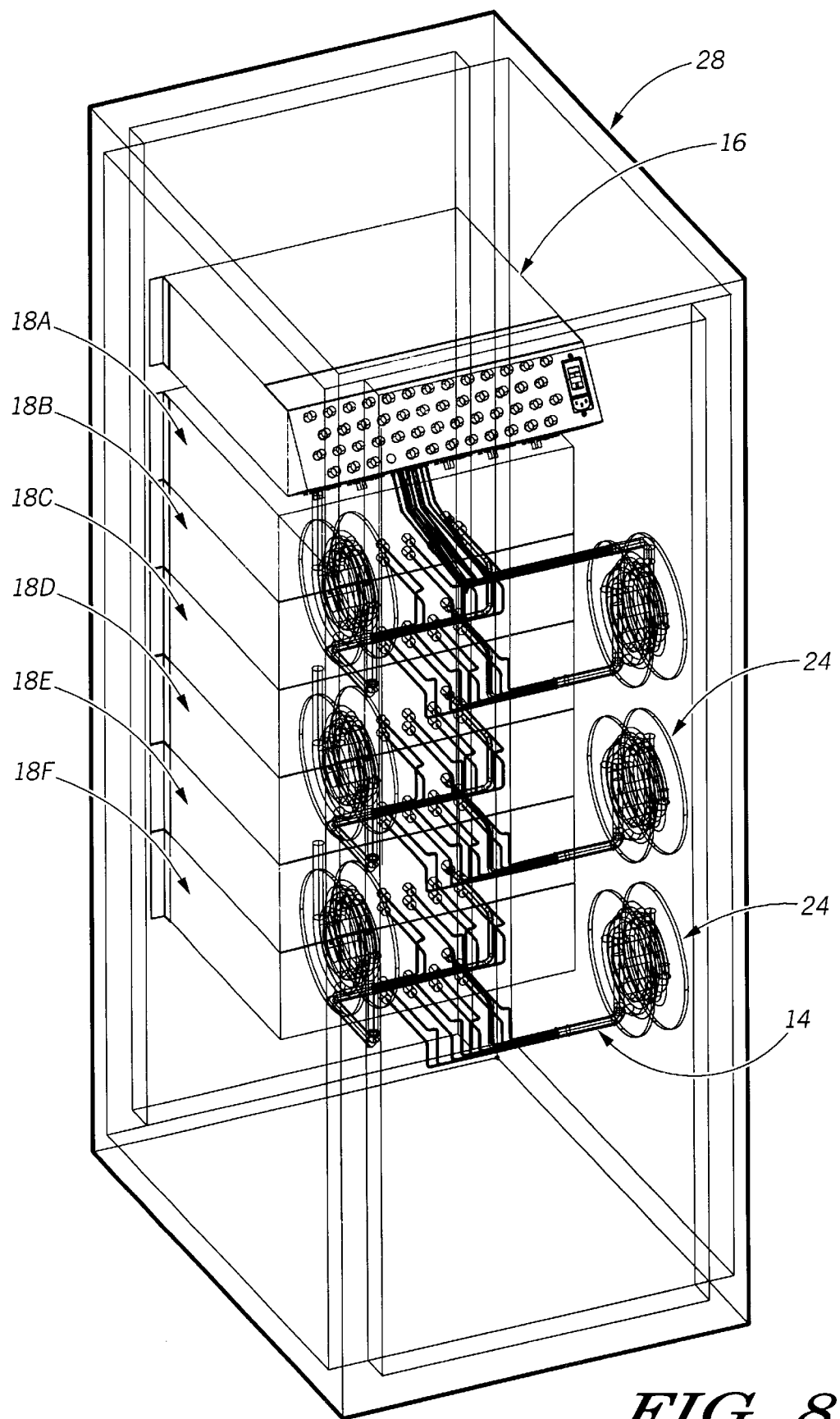
FIG. 8 is an orthographic wireframe view of an application of the cable management system according to at least one embodiment of the present invention.

FIG. 8 illustrates an exemplary embodiment of an application of a cable management system according to the present invention. An RF matrix switch 16 is mounted in a cabinet 28 at the top of a stack of six Cable Modem Termination Systems 18 which are also mounted in the cabinet 28. Each of six reeled cable assemblies 24 is removably mounted to an inside surface 26 of the cabinet 28 at relative heights corresponding to the relative positions of each Cable Modem Termination System 18. Each bundle 14 of cables 10 connects a Cable Modem Termination System to the RF matrix switch 16.

An exemplary embodiment of the present invention is used in conjunction with a Motorola CAS 2000 high availability HFC network system. Nine cables 10 are wrapped with a particularly colored mesh sleeving material 12 to form a bundle 14. Each of the nine cables 10 is six feet long to accommodate the longest length necessary to properly connect an RF matrix switch 16 to the most distant CMTS 18 in the system. Referring again to FIG. 1, the nine cables 10 of the exemplary embodiment include eight RG-179 return path coax cables 10A and one RG-6 forward path cable 10B. The RG-179 return path cables are used to minimize bundle size for increased manageability and to provide clearance near connection points for increased access and visibility. Use of RG-179 coaxial cable also prevents use of standard F-type connectors such as are commonly used on RG-59 and RG-6 coaxial cable at every head end. An F-type connector is installed on the CMTS side of the RG-179 coaxial cable which requires a crimped pin for the center contact thereby insuring a high level of impedance matching. Such impedance matching is required by the application of the exemplary embodiment. The RF matrix switch end of each of the eight return path cables in a bundle is terminated by a connector, for example a 75 Ohm MCX connector, or a mini-75 Ohm SMB connector, both from Johnson Components.

The RG-6 coaxial cable that is used for the forward path coaxial cable has a stranded center conductor to provide increased flexibility. The choice of RG-6 coaxial cable for the forward path having a stranded center conductor also precludes use of standard F-type connectors because standard F-type connectors of the CATV industry requires a solid center conductor. The single forward path coaxial cable in each bundle is terminated with a BNC connector on the RF matrix switch end and a pinned F-type connector on the CMTS end of the cable.

Although the cable management system according to the present invention is described herein in the context of interconnecting Cable Modem Termination Systems with RF matrix switches in a high availability HFC network system, it should be appreciated that the cable management system according to the present invention is useful in any number of interconnection systems. For example, the present invention facilitates use of a standard size cable in any system where various cable lengths are otherwise necessary to provide neat and proper cable routing.

Standard cable sizes are advantageous because they are more quickly installed or replaced and because fabrication and inventory control of a variety of different length cables is very costly. Consistent electrical characteristics which are inherent in standard length cables also provides significant advantages for various electrical systems or optical systems.

Each bundle 14 is wrapped or encased in an identifiable sheath or sleeving material 12. In the exemplary embodiment, the identifiable sheath or sleeving material 12 is TECH FLEX® expandable mesh sleeving. A different color TECH FLEX® sleeve is provided for each bundle 14 to identify the bundle for association with a particular CMTS 18 to RF matrix switch 16 connection. Alternative embodiments may use other types of sheaths or sleeving material 12 such as shrink tubing, tie wraps, wire ties or other wrapping structures or binding technique (for example, gluing the cables together), that are capable of maintaining cables in a bundle. Alternative embodiments for differentiation and identification of bundles include alphanumeric identification tags or labels, textural surface variations, and materials which fluoresce or appear in different colors when exposed to infrared or ultraviolet light.

The bundles 14 are each then wrapped around a reel 20 and the reels 20 are removably mounted near a respective set of connection points. In the exemplary embodiment, each reel 20 is removably mounted to the cabinet 28 or rack which contains the CMTS 18 units and the RF matrix switch 16. An appropriate length of cable 10 is determined to provide neat routing. The reel and cable assemblies 24 are easily removable and facilitate easy packaging and shipping. In an exemplary embodiment, hook/loop mounting tape 22 is used to provide removable mounting of reels 24 to a cabinet 28. It should be appreciated that any means of removably mounting a reel 24 to a cabinet 28 may be used without departing from the spirit and scope of the invention. For example, an alternative embodiment may use mating snap fasteners, screws or the like. Other embodiments may use hook or snap arms molded into a reel 24 to engage mating slots in a cabinet 28. While the exemplary embodiment is discussed in terms of a plastic reel 24, it should be appreciated that a reel 24 according to the invention may be made from any number of common manufacturing materials.

During fabrication of the reel assemblies 24, the bundled cables 10 are wrapped around a reel 20. Flexible C-clips 30 may be assembled to the reel 20 to retain sections of bundled cables 10 to the reel 20. The flexible C-clips 30 retain the bundled cables 10 within the reel 20 during storage, and shipping and may also retain excess lengths of cable within the reel 20 once the reel 20 is installed in a cabinet 28. Excess slack is prevented by only unwrapping the appropriate cable length 10 from a particular reel 20 and leaving the remainder of the cable bundle 14 wrapped around the reel 20. The present invention provides an error-proof method for field technicians to attach and route cables for providing a neat and secure assembly. It should be recognized that alternative embodiments of the invention may use other means to retain cable bundles 14 within a reel 20. For example, the cable space in a reel may be dimensioned to provide an interference fit with a cable 10 to retaining excess cable length within the reel 20.

Although described in terms of electrical cables and with embodiments for RF coax cable, the present invention can be utilized for other types of cables and patch cords, such as other coax cables besides RG-6 and RG-179, twisted pair cable, and optical patch cords and fiber optic cables.

Although the invention is described hereinbefore with respect to illustrative embodiments thereof, it will be appreciated that the foregoing and various other changes or omissions in the form and detail thereof may be made without departing from the spirit and scope of the invention.

What is claimed is:

1. A cable apparatus comprising:
   a bundle having multiple cables and ends;
   a reel, allowing said bundle to be wrapped around said reel; and
   retaining means to maintain a desired wrapping of said bundle around said reel;
   wherein said retaining means allows any of said ends of said bundle to extend up to all of the length available from said reel.

2. The cable apparatus according to claim 1 wherein said reel is removably mountable to a mounting structure.

3. The cable apparatus according to claim 1 wherein said reel is removably mountable to a mounting structure by hook and loop mounting tape.

4. The cable apparatus according to claim 1, wherein said retaining means allows said ends of said bundle to extend an unequal length from said reel.

5. The cable apparatus according to claim 1, wherein said retaining means are C-clips.

6. The cable apparatus according to claim 1, wherein an identifiable grouping structure at least partially encloses said bundle.

7. The cable apparatus according to claim 6, wherein said identifiable grouping structure includes a flexible mesh sleeve.

8. The cable apparatus according to claim 1, wherein the desired wrapping of said bundle is within a single channel on said reel.

* * * * *